United States Patent
Bentley et al.

(10) Patent No.: US 10,418,368 B1
(45) Date of Patent: Sep. 17, 2019

(54) BURIED LOCAL INTERCONNECT IN SOURCE/DRAIN REGION

(71) Applicant: GLOBALFOUNDRIES Inc., Grand Cayman (KY)

(72) Inventors: Steven J. Bentley, Menands, NY (US); Bipul C. Paul, Mechanicville, NY (US); Steven R. Soss, Cornwall, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/031,030

(22) Filed: Jul. 10, 2018

(51) Int. Cl.
| | |
|---|---|
| H01L 27/11 | (2006.01) |
| H01L 23/528 | (2006.01) |
| H01L 21/8238 | (2006.01) |
| H01L 29/06 | (2006.01) |
| H01L 21/768 | (2006.01) |
| H01L 29/78 | (2006.01) |
| H01L 29/10 | (2006.01) |
| H01L 29/08 | (2006.01) |

(52) U.S. Cl.
CPC .... *H01L 27/1104* (2013.01); *H01L 21/76802* (2013.01); *H01L 21/76834* (2013.01); *H01L 21/76843* (2013.01); *H01L 21/76877* (2013.01); *H01L 21/823807* (2013.01); *H01L 21/823814* (2013.01); *H01L 21/823828* (2013.01); *H01L 21/823878* (2013.01); *H01L 21/823885* (2013.01); *H01L 23/528* (2013.01); *H01L 29/0653* (2013.01); *H01L 29/0847* (2013.01); *H01L 29/1037* (2013.01); *H01L 29/7827* (2013.01)

(58) Field of Classification Search
CPC ......... H01L 21/76858; H01L 21/76834; H01L 21/76846; H01L 21/76805; H01L 21/02164; H01L 29/456
See application file for complete search history.

(56) References Cited

U.S. PATENT DOCUMENTS

| | | |
|---|---|---|
| 5,909,618 A | 6/1999 | Forbes et al. |
| 6,943,067 B2 | 9/2005 | Greenlaw |
| 9,312,388 B2 | 4/2016 | Xie et al. |
| 9,385,088 B2 | 7/2016 | Or-Bach et al. |
| 9,825,032 B1 | 11/2017 | Bentley et al. |

(Continued)

*Primary Examiner* — Dung A. Le
(74) *Attorney, Agent, or Firm* — Amerson Law Firm, PLLC

(57) ABSTRACT

A method for forming a buried local interconnect in a source/drain region is disclosed including, among other things, forming a plurality of VOC structures, forming a first source/drain region between a first pair of the plurality of VOC structures, forming a second source/drain region between a second pair of the plurality of VOC structures, and forming an isolation structure between the first and second source/drain regions. A first trench is formed in the first and second source/drain regions and the isolation structure. A liner layer is formed in the first trench, and a first conductive line is formed in the first trench. A dielectric material is formed above the first conductive line. A first opening is formed in the dielectric material to expose a portion of the first conductive line. A first conductive feature is formed in the first opening contacting the exposed portion of the first conductive line.

20 Claims, 13 Drawing Sheets

(56) References Cited

U.S. PATENT DOCUMENTS

| | | | |
|---|---|---|---|
| 2005/0095793 A1* | 5/2005 | Lee | H01L 29/41791 438/294 |
| 2015/0325575 A1* | 11/2015 | Park | H01L 29/0653 257/401 |
| 2016/0190065 A1 | 6/2016 | Liaw et al. | |
| 2018/0130704 A1* | 5/2018 | Li | H01L 21/02164 |

* cited by examiner

View X-X

US 10,418,368 B1

BURIED LOCAL INTERCONNECT IN SOURCE/DRAIN REGION

BACKGROUND

1. Field of the Disclosure

The present disclosure generally relates to the fabrication of semiconductor devices, and, more particularly, to various embodiments of a method for forming a buried local interconnect in a source/drain region and the resulting devices.

2. Description of the Related Art

In general, memory devices are the means by which electronic information is stored. There are many types of memory devices, e.g., SRAMs (Static Random Access Memory), DRAMs (Dynamic Random Access Memory), ROMs (Read Only Memory), etc., each of which has its own advantages and disadvantages relative to other types of memory devices. For example, SRAMs are typically employed in applications where higher speed and/or reduced power consumption is important, e.g., cache memory of a microprocessor, mobile phones and other mobile consumer products, etc. Millions of such memory devices are typically included in even very basic electronic consumer products. Irrespective of the type of memory device, there is a constant drive in the industry to increase the performance and durability of such memory devices. In typical operations, an electrical charge (HIGH) is stored in the memory device to represent a digital "1", while the absence of such an electrical charge or a relatively low charge (LOW) stored in the device indicates a digital "0". Read/write circuitry is used to access the memory device to store digital information on such a memory device and to determine whether or not a charge is presently stored in the memory device. These read/write cycles typically occur millions of times for a single memory device over its effective lifetime.

FIG. 1 depicts a typical prior art configuration of a 6T (six-transistor) SRAM memory cell 10 that includes two CMOS-based inverters—INV1 and INV2. In general, the SRAM cell 10 includes two NMOS pass gate transistors PG1, PG2, two PMOS pull-up transistors PU1, PU2, and two NMOS pull-down transistors PD1, PD2. The gates of the pass gate transistors PG1, PG2 are controlled by a word line (WL), and the inputs of the pass gate transistors PG1, PG2 are coupled to a bitline (BL), and an inverse bitline (BLX), respectively. Each of the PMOS pull-up transistors PU1, PU2 has its gate (14A, 14B, respectively) connected to the gate (16A, 16B, respectively) of a corresponding NMOS pull-down transistor PD1, PD2. The PMOS pull-up transistors PU1, PU2 have their drain regions (D) connected to the drain regions of corresponding NMOS pull-down transistors PD1, PD2 to form the inverters INV1 and INV2, each of which have a conventional configuration. The source regions (S) of the PMOS pull-up transistors PU1, PU2 are connected to a high reference potential, typically Vdd. The source regions (S) of the NMOS pull-down transistors PD1, PD2 are connected to a lower reference potential, typically Vss or ground. The PMOS pull-up transistor PU1 and the NMOS pull-down transistor PD1 make up the first inverter INV1 of the SRAM cell 10. The PMOS pull-up transistor PU2 and the NMOS pull-down transistor PD2 make up the second inverter INV2 of the SRAM cell 10. The main function of an inverter is to invert the input signal applied to its input, i.e., an inverter circuit outputs a voltage representing the opposite logic-level to the voltage applied to its input. If the applied input voltage is logically low, then the output voltage becomes high and vice versa.

The gate 14A of the PMOS pull-up transistor PU1 and the gate 16A of the NMOS pull-down transistor PD1 are cross-coupled (i.e., connected) to the drain regions (D) of the transistors PU2, PD2 of the other inverter at node N2. Similarly, the gate 14B of the PMOS pull-up transistor PU2 and the gate 16B of the NMOS pull-down transistor PD2 are cross-coupled (i.e., connected) to the drain regions (D) of the transistors PU1, PD1 at node N1. Hence, the potential present on the drain regions of the transistors PU1, PD1 (node N1) of the first inverter is applied to the gates of transistors PU2, PD2 of the second inverter and the charge serves to keep the second inverter in an ON or OFF state. The logically opposite potential is present on the drain regions of the transistors PU2, PD2 (node N2) of the second inverter and on the gates of the transistors PU1, PD1 of the first inverter, keeping the first inverter in the complementary OFF or ON state relative to the second inverter. Thus, the latch of the illustrated SRAM cell 10 has two stable states: a first state with a predefined potential present on charge storage node N1 and a low potential on charge storage node N2; and a second state with a low potential on charge storage node N1 and the predefined potential on charge storage node N2. Binary data are recorded by toggling between the two states of the latch. Sufficient charge must be stored on the charge storage node, and thus on the coupled gates of the associated inverter, to unambiguously hold one of the inverters "ON" and unambiguously hold the other of the inverters "OFF", thereby preserving the memory state. In manufacturing such an SRAM cell 10, a conductive contact structure must be formed to cross-couple (or conductively couple) a shared drain region on the first inverter with a gate structure of the second inverter. The area of the semiconductor device needed for routing the cross-coupling structure limits the scaling of the footprint of the device.

The present disclosure is directed to a method for forming a buried local interconnect in a source/drain region and the resulting devices.

SUMMARY

The following presents a simplified summary of illustrative embodiments of the invention in order to provide a basic understanding of some aspects of the illustrative embodiments of the invention. This summary is not an exhaustive overview of the illustrative embodiments of the invention specifically discussed herein. It is not intended to identify key or critical elements of the invention or to delineate the scope of the invention. Its sole purpose is to present some concepts in a simplified form as a prelude to the more detailed description that is discussed later.

Generally, the present disclosure is directed to various embodiments of a method for forming a buried local interconnect in a source/drain region and the resulting devices. One illustrative method includes, among other things, forming a plurality of vertically oriented channel (VOC) structures, forming a first source/drain region between a first pair of the plurality of VOC structures, forming a second source/drain region between a second pair of the plurality of VOC structures, and forming an isolation structure between the first and second source/drain regions. A first trench is formed in the first and second source/drain regions and the isolation structure. A liner layer is formed in the first trench, and a first conductive line is formed in the first trench. A dielectric material is formed above the first conductive line. A first opening is formed in the dielectric material to expose a portion of the first conductive line. A first conductive feature is formed in the first opening contacting the exposed portion of the first conductive line.

Another illustrative method includes, among other things, forming a first set of vertical transistors above a first source/drain region, the first set including a first pull-down transistor, a first pull-up transistor, and a first pass gate transistor, and forming a second set of vertical transistors above a second source/drain region, the second set including a second pull-down transistor, a second pull-up transistor, and a second pass gate transistor, wherein the first and second sets of vertical transistors are interconnected to define a memory cell. An isolation structure is formed between the first and second source/drain regions. First and second trenches are formed in the first and second source/drain regions and the isolation structure. A liner layer is formed in the first and second trenches, and the liner layer is patterned to expose a portion of the first source/drain region in the first trench and to expose a portion of the second source/drain region in the second trench. The method further includes forming a first conductive line in the first trench, the first conductive line contacting the exposed portion of the first source/drain region, and forming a second conductive line in the second trench, the second conductive line contacting the exposed portion of the second source/drain region. A bottom spacer is formed above the first and second source/drain regions and the first and second conductive lines. A first shared gate structure is formed for the first pull-down transistor and the first pull-up transistor. A second shared gate structure is formed for the second pull-down transistor and the second pull-up transistor. A first opening in the bottom spacer is formed to expose a portion of the first conductive line, and a second opening is formed in the bottom spacer to expose a portion of the second conductive line. A first gate shunt contact is formed in the first opening connecting the second shared gate structure to the exposed portion of the first conductive line to define a first storage node of the memory cell. A second gate shunt contact is formed in the second opening connecting the first shared gate structure to the exposed portion of the second conductive line to define a second storage node of the memory cell.

An illustrative device includes, among other things, a plurality of vertically oriented channel (VOC) structures, a first source/drain region positioned between a first pair of the plurality of VOC structures, a second source/drain region positioned between a second pair of the plurality of VOC structures, and an isolation structure positioned between the first and second source/drain regions. A first trench is defined in the first and second source/drain regions and the isolation structure. A liner layer lines the first trench. A first buried interconnect line is positioned in the first trench. A dielectric material is positioned above the first buried interconnect line. A first conductive feature is positioned in the dielectric material and contacts a portion of the first buried interconnect line.

BRIEF DESCRIPTION OF THE DRAWINGS

The disclosure may be understood by reference to the following description taken in conjunction with the accompanying drawings, in which like reference numerals identify like elements, and in which.

Figure 1:
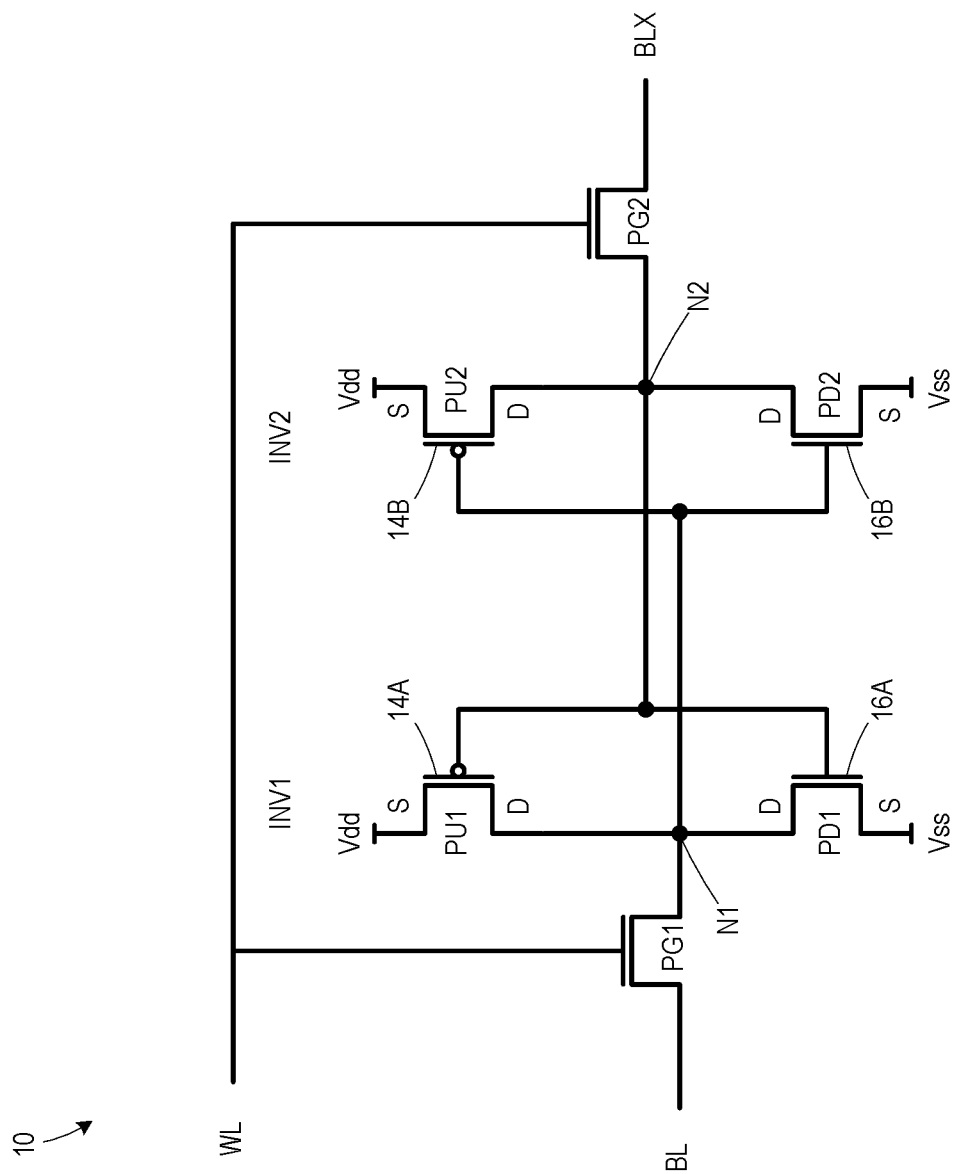
FIG. 1 is an electrical schematic of an illustrative prior art SRAM cell that includes two CMOS-based inverters.

While the subject matter disclosed herein is susceptible to various modifications and alternative forms, specific embodiments thereof have been shown by way of example in the drawings and are herein described in detail. It should be understood, however, that the description herein of specific and illustrative embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. The various layers of material described below may be formed by any of a variety of different known techniques, e.g., a chemical vapor deposition (CVD) process, an atomic layer deposition (ALD) process, a thermal growth process, epitaxial growth processes, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 2-13 are various views that depict methods for forming buried local interconnects in a source/drain region and the resulting IC products 200, 200'. The presently disclosed illustrative embodiments of the inventions will be discussed in the context where the vertical transistor memory cell includes illustrative vertical transistor devices 202 formed above a substrate 204.

Figure 2:
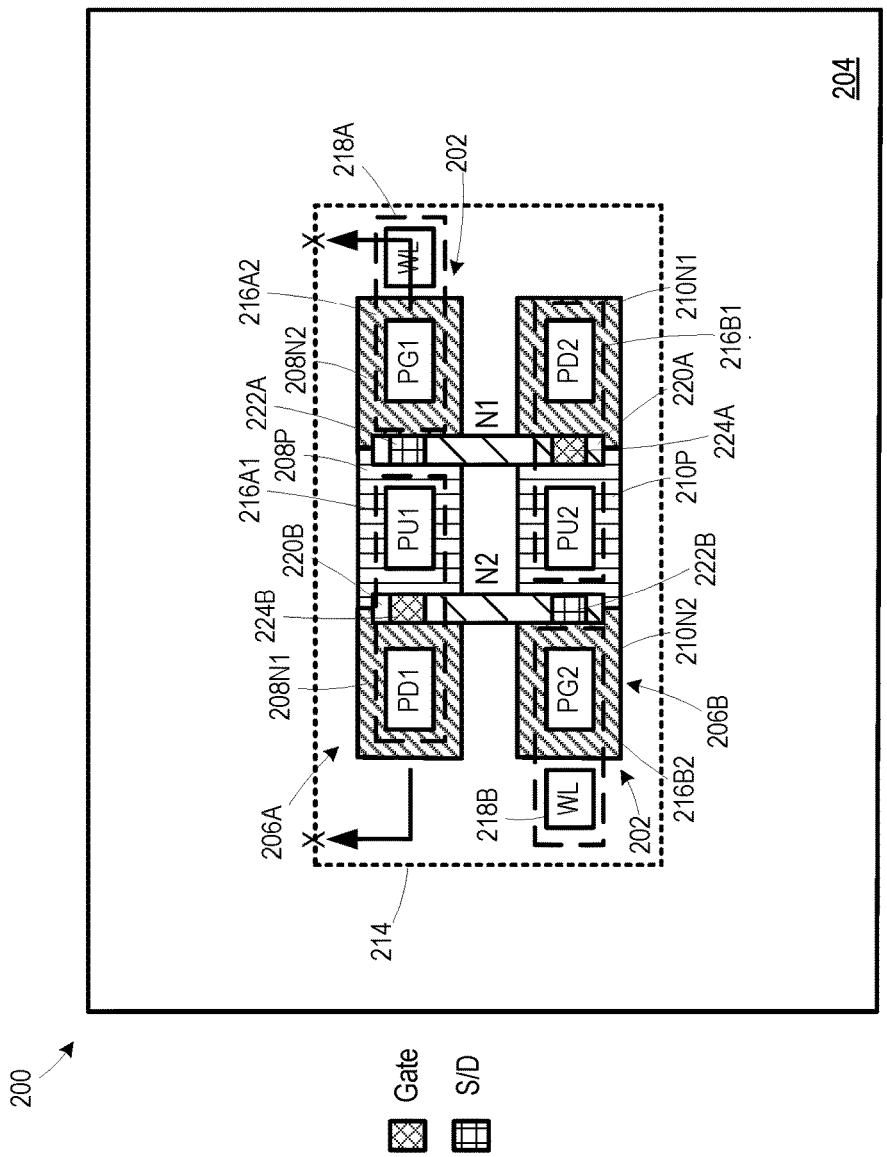
FIGS. 2-13 are various views that depict methods for forming buried local interconnects in a source/drain region and the resulting devices.

FIG. 2 is a simplistic plan view of an embodiment of the IC product 200 that includes an illustrative dual port SRAM cell. The dual port SRAM cell includes illustrative and schematically depicted vertical transistor devices 202, including NMOS pass gate transistors PG1 and PG2, two PMOS pull-up transistors PU1, PU2, and two NMOS pull-down transistors PD1, PD2. Each of the vertical transistors includes a simplistically depicted vertically oriented channel (VOC) structure. The VOC structures of the vertical transistor devices 202 may be fins, as shown in the illustrated embodiment, but vertical structures with different horizontal cross-sections may be used, such as circular, elliptical or rectangular pillars. The relative strengths of the vertical transistor devices 202 may be varied by adjusting the cross-sectional area, or by connecting multiple devices in parallel. As will be appreciated by those skilled in the art, the drawings provided herein depict the formation of the IC product 200 at a given point in the process flow disclosed herein. It should be understood that these drawings are not intended to, nor do they, show the full, final formation of functional vertical transistor devices 202.

The fins 202 are formed above two substantially rectangular-shaped (when viewed from above) merged doped source/drain regions—a first merged doped source/drain region 206A and a second merged doped source/drain region 206B. Each of the merged doped source/drain regions 206A, 206B is contiguous. The merged doped source/drain region 206A includes a P-doped region 208P in which the PU1 transistor is formed, and two N-doped regions 208N1, 208N2 in which the PD1 and PG1 transistors are formed, respectively. The merged doped source/drain region 206B includes a P-doped region 210P in which the PU2 transistor is formed, and two N-doped regions 210N1, 210N2 in which the PD2 and PG2 transistors are formed, respectively. As described more fully below, these N- and P-type doped regions may be formed in a semiconductor material, i.e., either in an epitaxial semiconductor material formed above the semiconductor substrate 204 or in the semiconductor substrate 204 itself. These N-type and P-type doped regions are "merged" since there is no isolation material positioned between the doped regions within a single merged doped source/drain region 206A, 206B, e.g., the P-doped region 208P directly engages the N-doped regions 208N1, 208N2 along interfaces within the first merged doped source/drain region 206A. Moreover, a conductive layer 212 (e.g., silicide—shown in FIG. 3, but omitted in FIG. 2) is formed above each of the merged doped source/drain regions 206A, 206B to form a conductive element that connects the bottom source/drain regions 208P/208N1/208N2 and 210P, 210N1, 210N2 at least over the boundaries of the merged doped source/drain regions 206A, 206B. It should be understood that the conductive element may be formed in various ways and may have a different structure and topography than the example illustrated in FIG. 3. A shallow trench isolation (STI) structure 214 separates the first merged doped source/drain region 206A from the second merged doped source/drain region 206B.

FIG. 2 depicts (in dashed lines) various separate and discrete conductive gate structures 216A1 216A2, 216B1, 216B2, collectively referred to as gate structures 216. The conductive gate structures 216 are positioned around channel regions of the fins 202 and may be formed using either gate-first or replacement gate manufacturing techniques. In general, the conductive gate structures 216 may each include a gate insulation layer, a conductive gate electrode, a work function material, one or more barrier layers, etc. (not separately shown). The gate structure 216A1 is shared by the PD1 transistor and the PU1 transistor, while the gate structure 216B1 is shared by the PD2 transistor and the PU2 transistor. Each of the pass gate transistors PG1, PG2 has its own discrete gate structure 216A2, 216B2 coupled to word line contacts 218A, 218B, respectively.

Buried local interconnects 220A, 220B in merged doped source/drain regions 206A, 206B are formed between the P-doped region 208P and the N-doped region 208N2. The buried local interconnect 220A includes a source/drain contact 222A connected to the first merged doped source/drain region 206A and a gate shunt contact 224A connected to the shared gate structure 216B1, thereby defining the cross-coupling structure N1. The buried local interconnect 220B includes a source/drain contact 222B connected to the second merged doped source/drain region 206B and a gate shunt contact 224B connected to the shared gate structure 216B1, thereby defining the cross-coupling structure N2. As described in greater detail below, the buried local interconnects 220A, 220B are formed in trenches defined in the merged doped source/drain regions 206A, 206B and in the STI structure 214, thereby allowing a smaller footprint for the device 200.

Several of the drawings herein are cross-sectional drawings depicting the view taken at the location indicated by arrows X-X (i.e., a cross-sectional view taken through PU1 and PG1 in the merged source/drain region 206A). The second merged doped source/drain region 206B is symmetrical to the first merged doped source/drain region 206A (i.e., mirrored and flipped), so it is not illustrated separately in the cross-sectional views.

Figure 3:
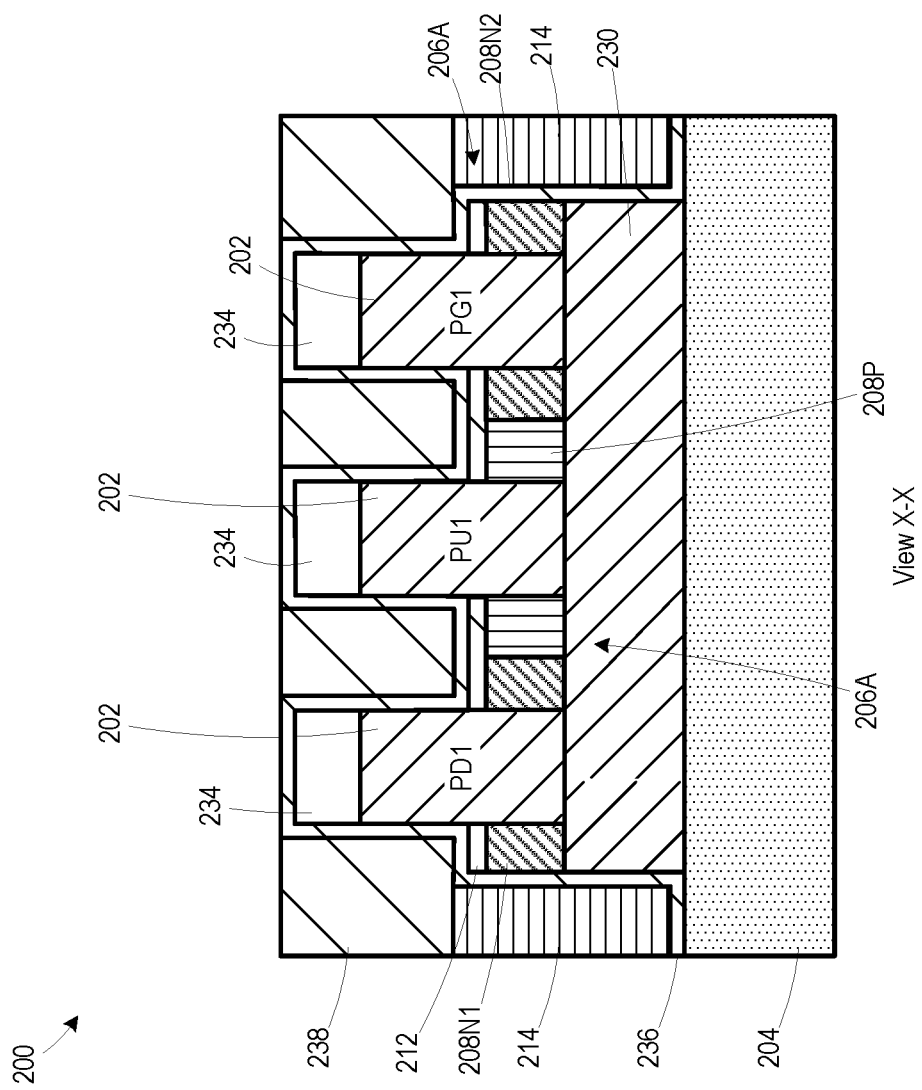

FIG. 3 is a cross-sectional view of the device 200 through the first merged doped source/drain region 206A along line X-X. The IC product 200 is formed in and above a semiconductor substrate 204. The substrate 204 may have a variety of configurations, such as the bulk substrate configuration depicted herein or a semiconductor-on-insulator (SOI) configuration. Such an SOI substrate includes a bulk semiconductor layer, a buried insulation layer positioned on the bulk semiconductor layer and an active semiconductor layer positioned on the buried insulation layer, wherein the fins 202 are formed in and above the active layer. The active layer and/or the bulk semiconductor layer may be made of silicon or they may be made of semiconductor materials other than silicon, and they both do not have to be made of the same semiconductor material. Thus, the terms "substrate" or "semiconductor substrate" should be understood to cover all semiconducting materials and all forms of such materials.

The first merged doped source/drain region 206A includes a well region 230 (e.g., N-doped) defined in the substrate 204 (e.g., P-doped) and bounded by shallow trench isolation (STI) structures 214. It should be understood that multiple well doping types and polarities may be present in a single structure. The N-doped regions 208N1, 208N2, and the P-doped region 208P are formed in the well region 230 and the conductive layer 212 (e.g., silicide) was formed on the top surface thereof. The N-doped regions 208N1, 208N2 define the bottom source/drain regions of the N-type transistors PD1, PG1, respectively. The P-doped region 208P defines the bottom source/drain region of the P-type transistor PU1. A hard mask layer 234 (i.e., used in patterning the fins 202) is positioned on upper surfaces of the fins 202. A spacer layer 236 was formed above the conductive layer 212 and the fins 202. A dielectric layer 238 (e.g., silicon dioxide, low-k dielectric material, ultra-low-k dielectric material, etc.) was formed above the spacer layer 234 and between the fins 202. The dielectric layer 238 was planarized to expose the upper surface of the spacer layer 236.

Figure 4:
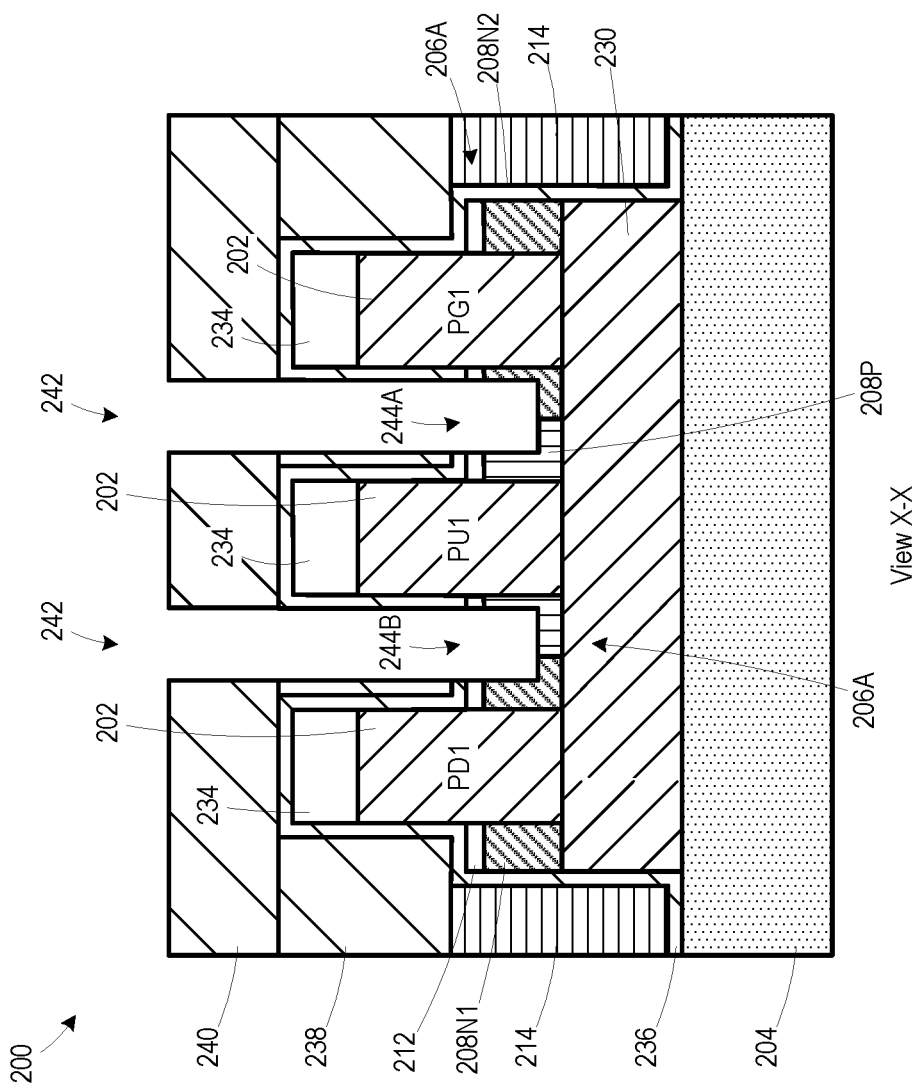

FIG. 4 illustrates the device 200 after several processes were performed. A mask layer 240 (e.g., a stack of patterning layers) was formed above the dielectric layer 238 and patterned to define openings 242 extending in a direction perpendicular to the page. One or more etch processes (e.g., non-selective to oxide and silicon) were performed to define trenches 244A, 244B in the source/drain regions 208P, 208N1, 208N2. The trenches 244A, 244B also extend through the portion of the STI structure 214 positioned between the merged doped source/drain regions 206A, 206B and into the source/drain regions 210P, 210N1, 210N2 of the merged doped source/drain region 206B (not visible in FIG. 3). The trenches 244A, 244B correspond to the layout of the buried local interconnects 220A, 220B shown in FIG. 2. In some embodiments, the trench etch may be self-aligned with respect to the sidewall portions of the spacer layer 236 formed on the fins 202. In some embodiments, the trenches 244A, 244B may be different depths to support various routing schemes. Appropriate masking and etching steps may be provided to facilitate the different depths.

Figure 5:
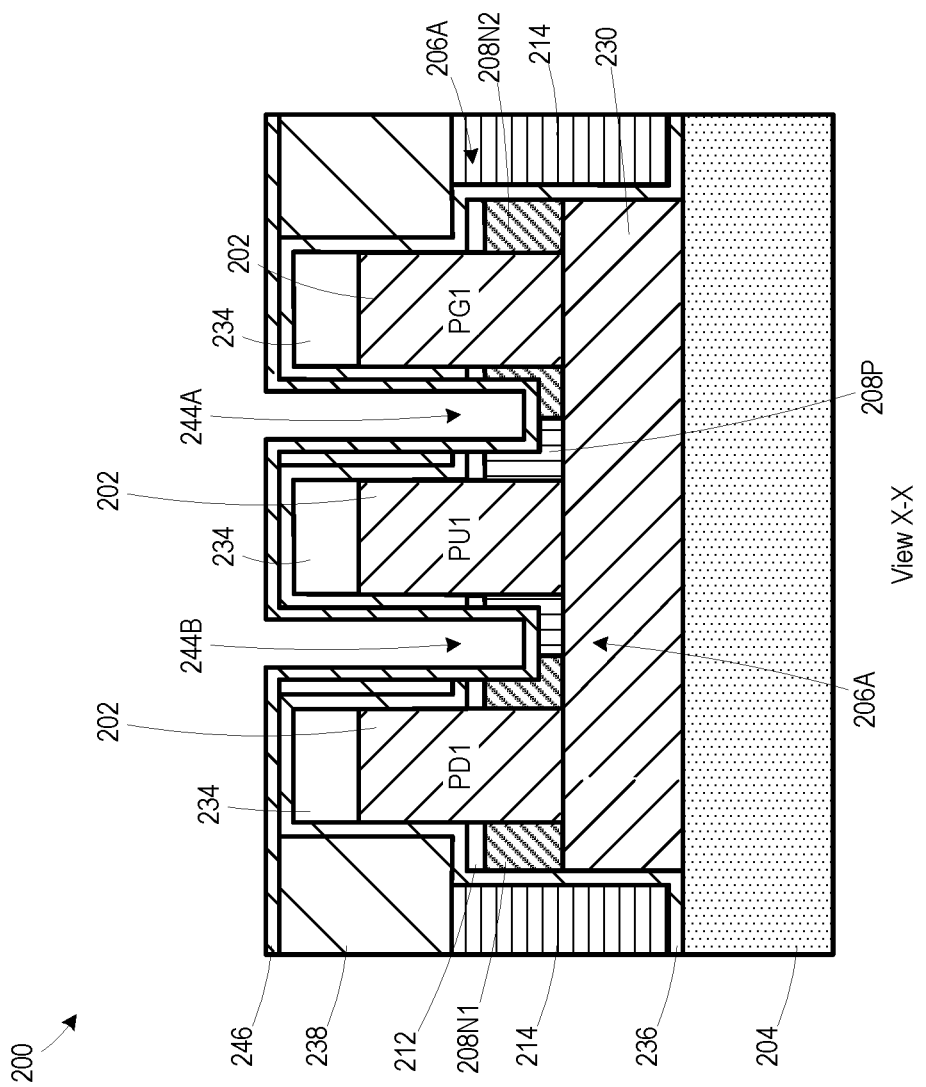

FIG. 5 illustrates the device 200 after a strip process was performed to remove the mask layer 240 and a liner layer 246 was formed in the trenches 244A, 244B.

Figure 6:
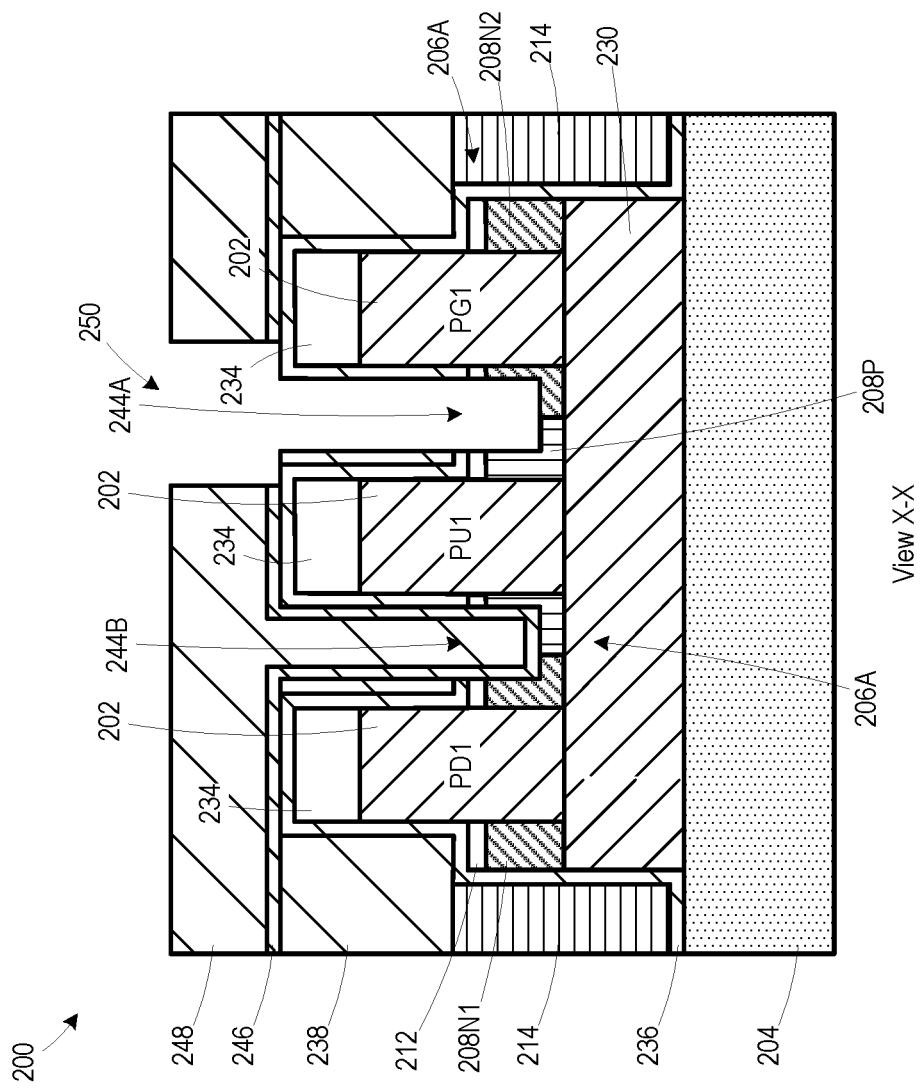

FIG. 6 illustrates the device 200 after a mask layer 248 was formed above the liner layer 246 and patterned to define an opening 250 corresponding to the source/drain contact 222A above the trench 244A. The mask layer 248 covers the trench 244B above the merged source/drain region 206A, but a symmetric opening (not visible) was formed above the merged source/drain region 206B corresponding to the source/drain contact 222B. An etch process was performed through the mask layer 248 to define an opening in the liner layer 246, thereby exposing the underlying source/drain regions 208P, 208N2.

Figure 7:
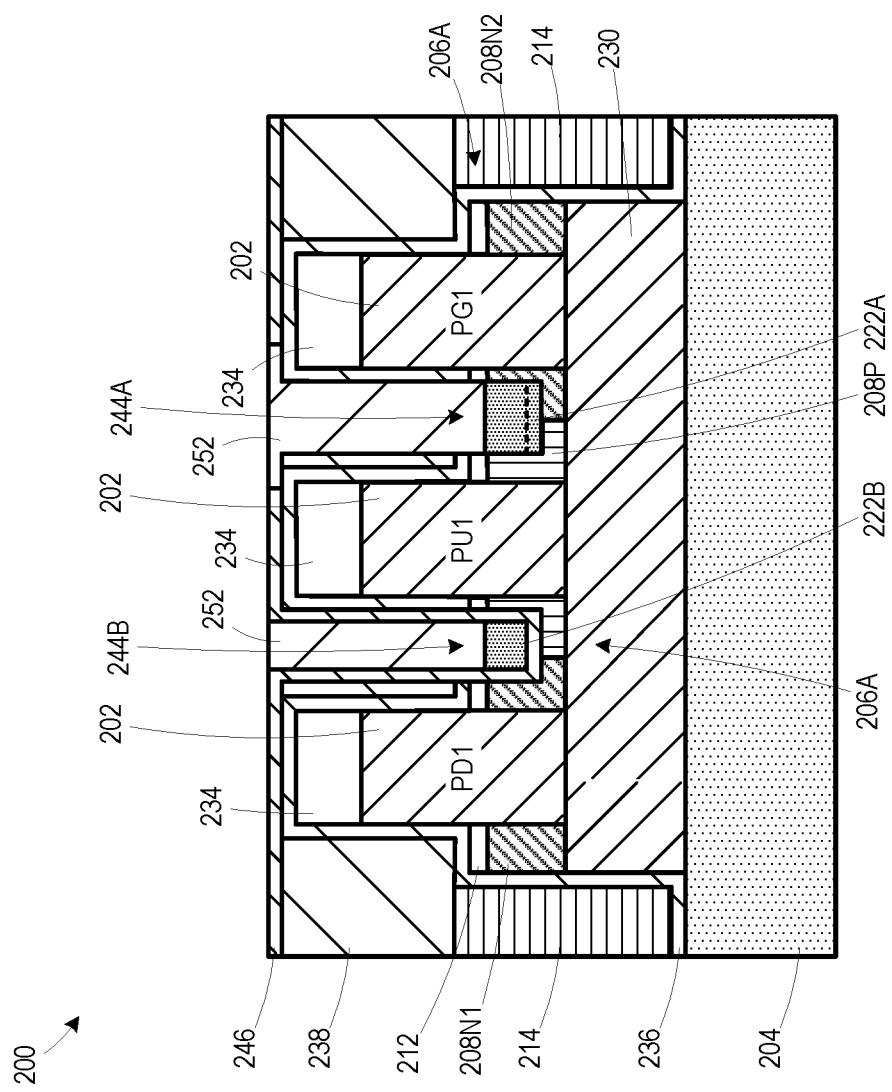

FIG. 7 illustrates the product 200 after several processes were performed. A strip process was performed to remove the mask layer 248. One or more deposition processes were performed to fill the trenches 244A, 244B with a conductive material. In some embodiments, the conducive material may include a silicide liner and a metal fill material (e.g., W, Co, Ru, etc.). In some embodiments, a planarization process may be performed to remove portions of the conductive material outside the trenches 244A, 244B, and a recess etch may be performed to reduce the height of the conductive material and define the buried local interconnects 220A, 220B. A deposition process was performed to form a dielectric material 252 in the trenches 244A, 244B. A planarization process was performed to remove portions of the dielectric material 252 formed outside the trenches 244A, 244B. The dielectric material 252 may include multiple layers, such as a silicon nitride liner and an oxide-based fill material or it may include low-k materials.

Because a portion of the liner layer 246 was removed in the trench 244A, the source/drain contact 222A was formed between the buried local interconnect 220A and the merged source/drain region 206A. The liner layer 246 isolates the buried local interconnect 220B from the merged source/drain region 206A. Similarly, the buried local interconnect 220B contacts the merged source/drain region 206B to define the source/drain contact 222B (not visible) and the liner layer 246 isolates the buried local interconnect 220A from the merged source/drain region 206B.

Figure 8:
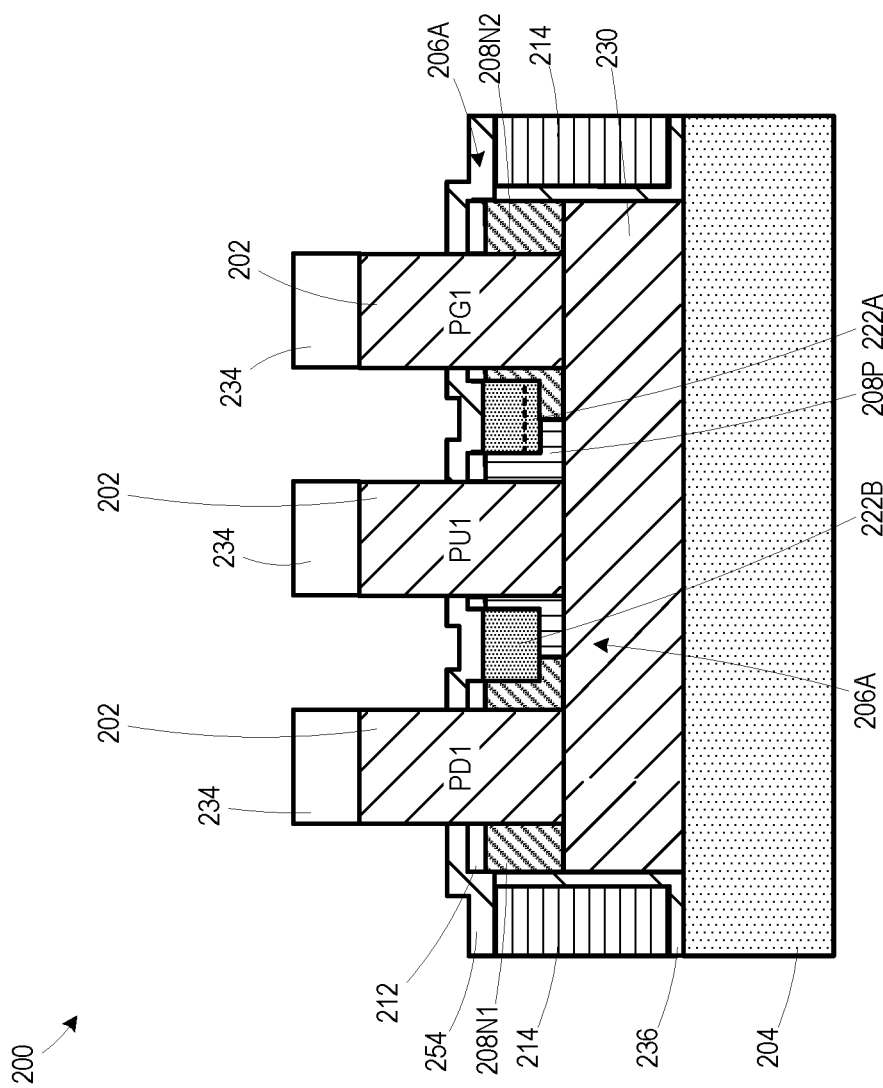

FIG. 8 illustrates the product 200 after several processes were performed. A fin reveal etch was performed to expose the fins 202. The fin reveal etch may also expose the top surfaces of the buried local interconnects 220A and the merged source/drain regions 206A, 206B depending on the recess depth. A deposition process was performed to form a bottom spacer 254 above the buried local interconnects 220A and the merged source/drain regions 206A, 206B. The bottom spacer 254 defines the lower boundary of a channel region on the fins 202.

Figure 9:
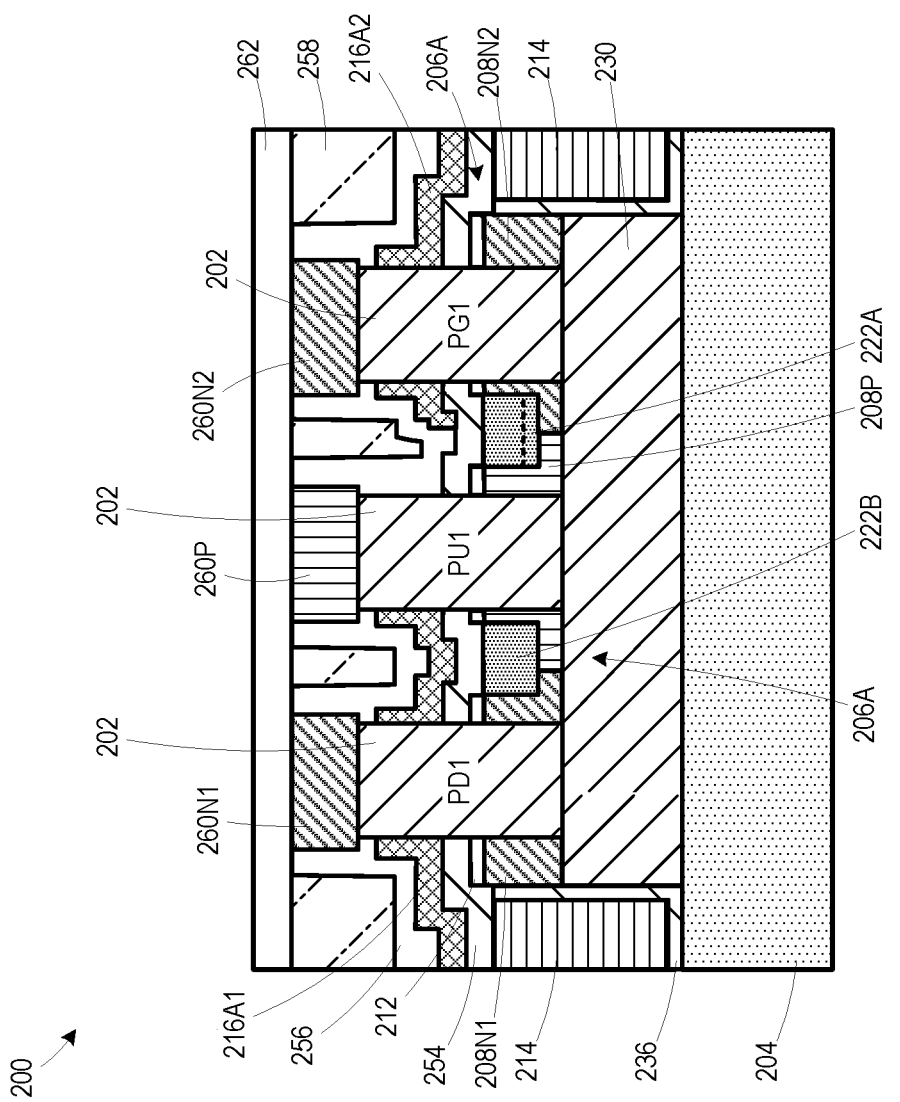

FIG. 9 illustrates the device 200 after several processes were performed. One or more deposition processes were performed to form the gate structures 216 (see FIG. 2) on channel regions of the fins 202. The gate structures 216A1, 216A2 are visible in FIG. 9. The gate structures 216 may include a gate insulation layer (e.g., high-k dielectric, such as hafnium oxide), one or more barrier or work function material layers (e.g., TiN, TiC, or a stack of layers), and a conductive layer (e.g., metal) (not separately shown). A top spacer 256 was formed, and a dielectric layer 258 was formed between the fins 202. The hard mask layers 234 were removed, and top source/drain regions 260N1, 260N2, 260P (collectively 260) were epitaxially grown on upper surfaces of the fins 202. A cap layer 262 was formed above the dielectric layer 258 and the top source/drain regions 260. The steps of FIG. 9 are typical device fabrication steps, and are not described in greater detail to avoid obscuring the present subject matter.

Figure 10:
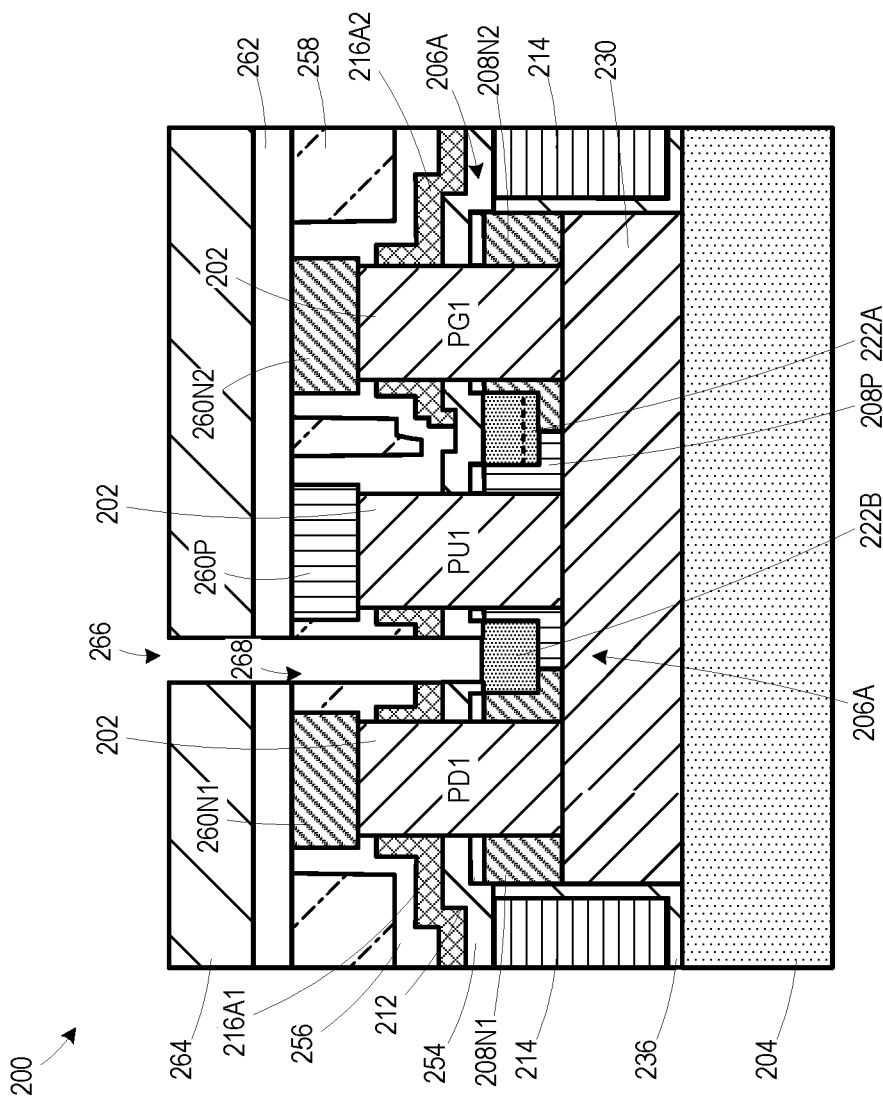

FIG. 10 illustrates the device 200 after a mask layer 264 was formed above the cap layer 262 and patterned to define an opening 266 corresponding to the gate shunt contact 224B. An etch process was performed through the mask layer 264 to define an opening 268 extending through the cap layer 262, the dielectric layer 258, the top spacer 256, the gate structure 216A1, and the bottom spacer 254, thereby exposing the underlying buried local interconnect 220B. A symmetric opening (not visible) was formed above the merged source/drain region 206B corresponding to the gate shunt contact 224A to expose the buried local interconnect 220A.

Figure 11:
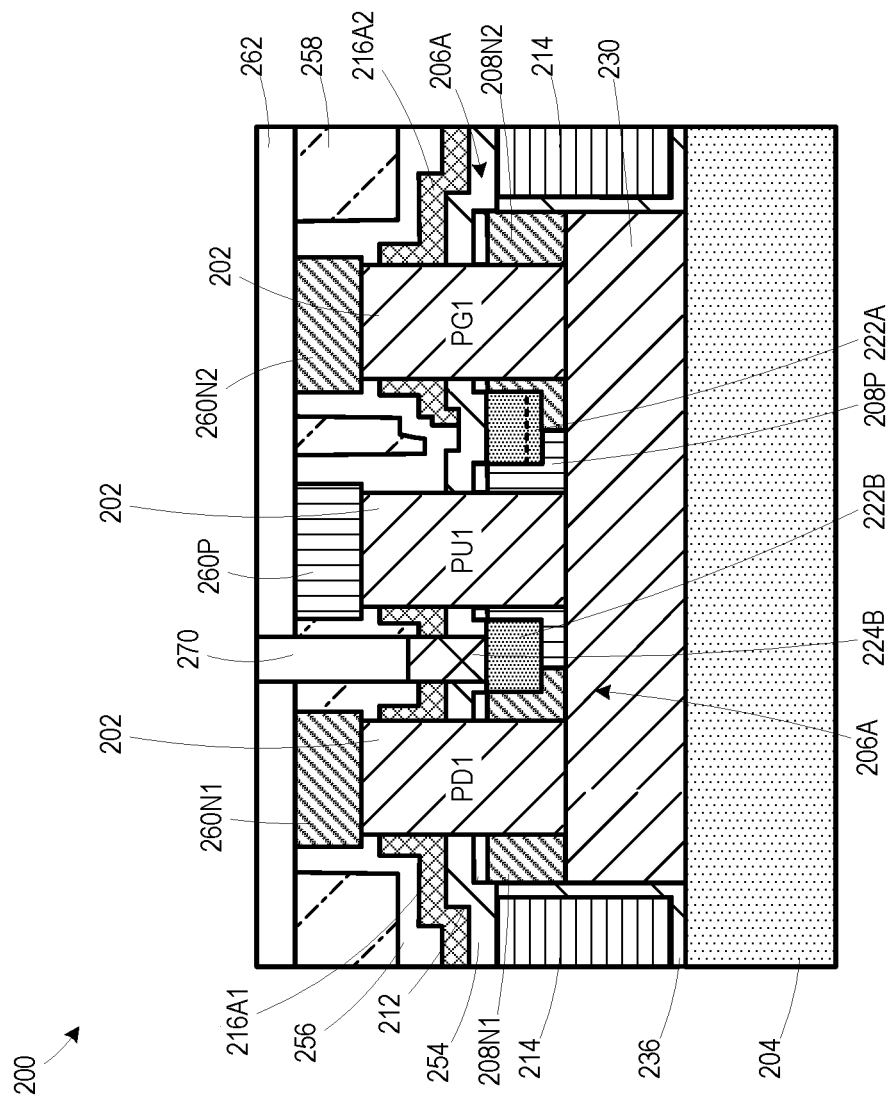

FIG. 11 illustrates the device 200 after several processes were performed. The mask layer 264 was stripped. One or more deposition processes were performed to form the gate shunt contact 224B. The gate shunt contact 224B connects the gate structure 216A1 to the buried local interconnect 220B. The gate shunt contact 224B may include multiple layers. The opening 268 may be overfilled with a conductive material. The conductive material may be planarized and etched back to define the gate shunt contact 224B. A deposition process was performed to fill the opening with a dielectric material 270 (e.g., silicon nitride).

Figure 12:
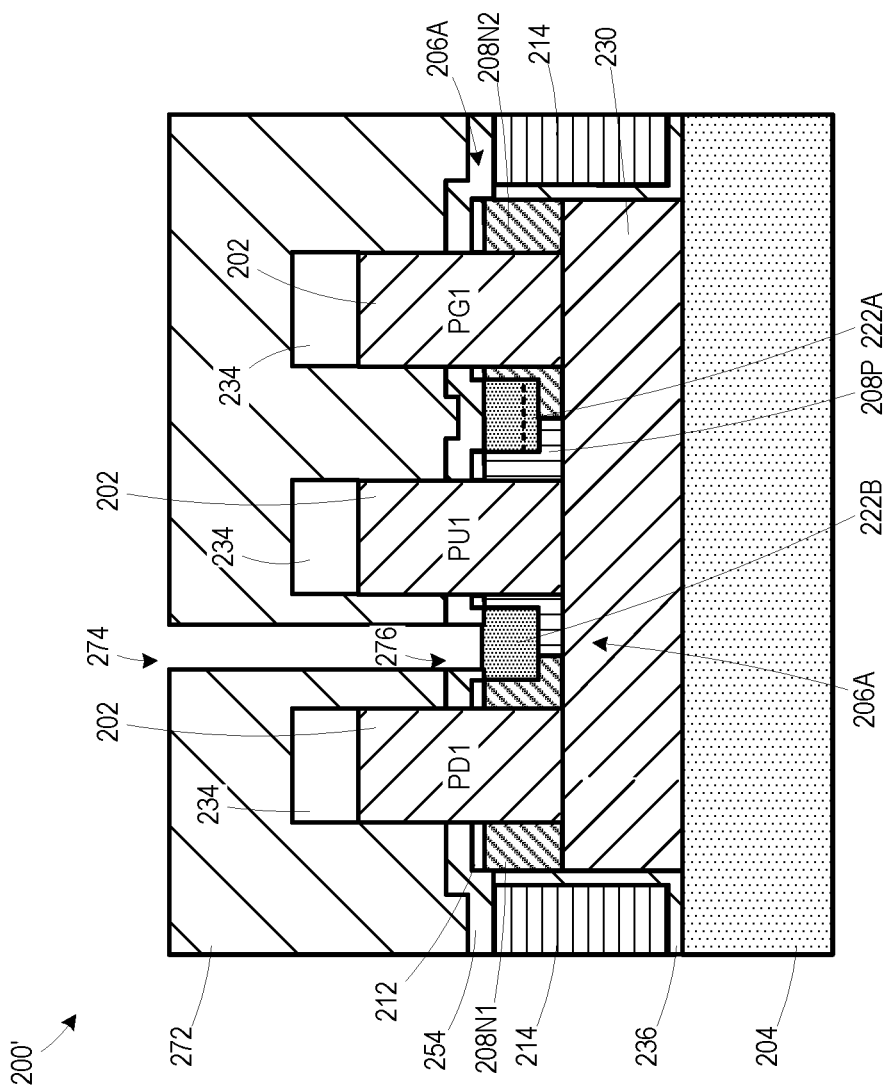

FIG. 12 illustrates an alternative process flow for forming the device 200'. Starting with the device shown in FIG. 8, a mask layer 272 was formed above bottom spacer 254 and patterned to define an opening 274 corresponding to the gate shunt contact 224B. An etch process was performed through the mask layer 272 to define an opening 276 extending through the bottom spacer 254, thereby exposing the underlying buried local interconnect 220B. A symmetric opening (not visible) was formed above the merged source/drain region 206B corresponding to the gate shunt contact 224A to expose the buried local interconnect 220A.

Figure 13:
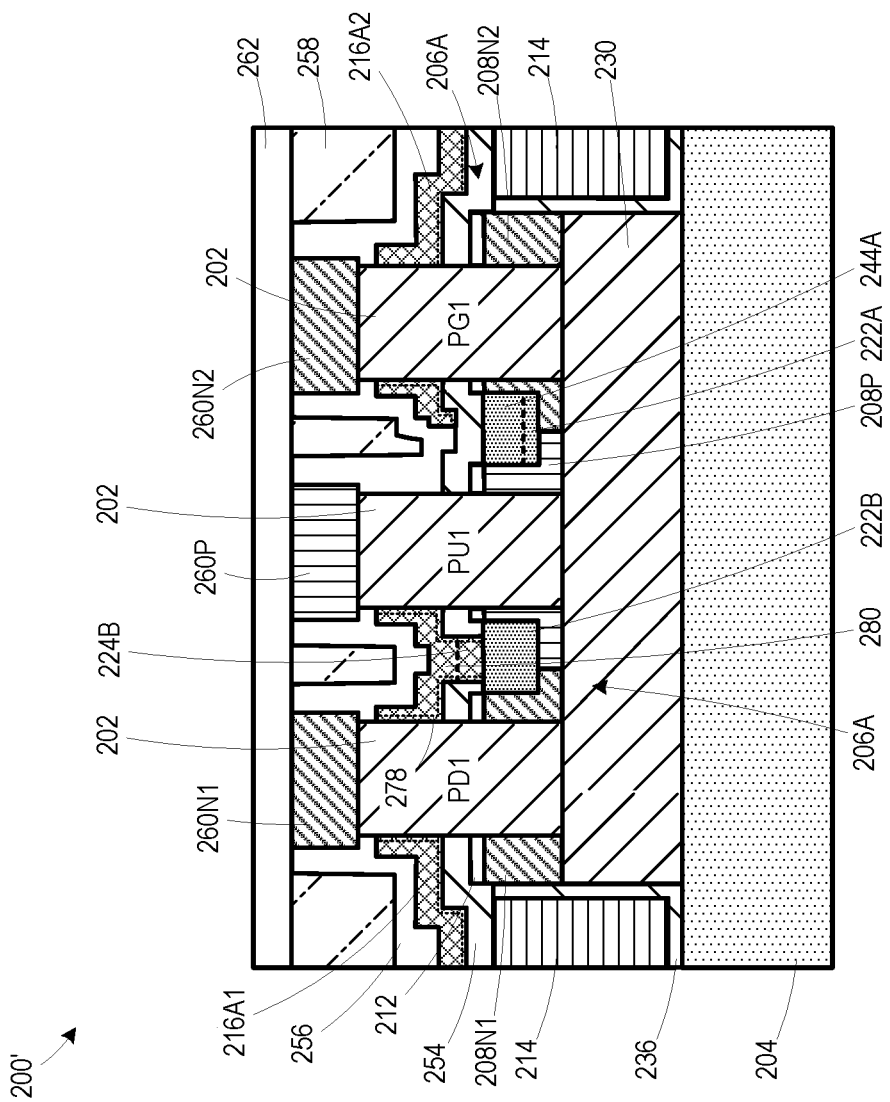

FIG. 13 illustrates the device 200' of FIG. 12 after the additional processing described in reference to FIG. 9 was performed. The gate structure 216A1 is formed in the opening 276 and directly contacts the buried local interconnect 220B to define the gate shunt contact 224B. When forming the gate structure 216A1, a gate insulation layer 278 (represented as a dashed line) may be formed. A mask similar to that shown in FIG. 12 may be used to remove a portion of the gate insulation layer 278 at the bottom of the opening 276 to expose the buried local interconnect 220B, and a conductive gate electrode 280 may be subsequently formed above the gate insulation layer 278. A portion of the conductive gate electrode 280 formed in the opening on the gate insulation layer 278 forms the buried local interconnect 220B.

At this point in the process flow, traditional manufacturing operations may be performed to complete the fabrication of the IC products 200, 200'. For example, one or more layers of insulating material (not shown) may be formed and various conductive contact structures (not shown), such as contact structures to contact other areas, may be formed in these additional layers of insulating material.

Although the examples in FIGS. 2-13 relate to the application of the buried interconnects 220A, 220B in an SRAM architecture, the application of the present subject matter is not limited to an SRAM. The buried interconnects 220A, 220B may be used as a general routing layer. In this respect, the source/drain contact 222A may not be present in all embodiments. The upper contacts that interface with the buried interconnects 220A, 220B may be gate shunt contacts 222A, 222B as illustrated, or the upper contacts may connect to other features, such as metallization layer contacts.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a plurality of vertically oriented channel (VOC) structures;
    forming a first source/drain region between a first pair of the plurality of VOC structures;
    forming a second source/drain region between a second pair of the plurality of VOC structures;
    forming an isolation structure between the first and second source/drain regions;
    forming a first trench in the first and second source/drain regions and the isolation structure;
    forming a liner layer in the first trench;
    forming a first conductive line in the first trench;
    forming a dielectric material above the first conductive line;
    forming a first opening in the dielectric material to expose a portion of the first conductive line; and
    forming a first conductive feature in the first opening contacting the exposed portion of the first conductive line.

2. The method of claim 1, wherein the dielectric material comprises a bottom spacer, and portions of the plurality of VOC structures extend above the bottom spacer.

3. The method of claim 2, wherein the first conductive feature comprises a gate electrode of a gate structure.

4. The method of claim 3, further comprising forming the gate structure above the bottom spacer around channel regions of the second pair of the VOC structures.

5. The method of claim 4, further comprising:
    forming a first dielectric layer above the gate structure, wherein forming the first opening in the dielectric material comprises forming the first opening in the first dielectric layer, the gate structure, and the bottom spacer; and
    forming a gate shunt contact in the opening connecting the gate structure to the first conductive line.

6. The method of claim 2, further comprising:
    forming the first opening in the bottom spacer; and
    forming a gate structure above the bottom spacer and in the first opening, the gate structure including a gate electrode contacting the exposed portion of the first conductive line.

7. The method of claim 6, wherein forming the gate structure comprises:
    forming a gate insulation layer above the bottom spacer and in the first opening in the bottom spacer;
    removing a portion of the gate insulation layer disposed in the first opening; and
    forming the gate electrode above the gate insulation layer and in the first opening.

8. The method of claim 6, further comprising:
    patterning the liner layer to expose a portion of the first source/drain region while covering the second source/drain region in the first trench; and
    forming the first conductive line in the first trench, the first conductive line contacting the exposed portion of the first source/drain region, wherein the first conductive line comprises a storage node of a memory cell.

9. The method of claim 1, further comprising:
    patterning the liner layer to expose a portion of the first source/drain region while covering the second source/drain region in the first trench;
    forming the first conductive line in the first trench, the first conductive line contacting the exposed portion of the first source/drain region;
    forming a second trench in the first and second source/drain regions and the isolation structure;
    patterning the liner layer to expose a portion of the second source/drain region while covering the first source/drain region in the second trench;
    forming a second conductive line in the second trench, the second conductive line contacting the exposed portion of the second source/drain region;
    forming a dielectric material above the second conductive line;
    forming a second opening in the dielectric material to expose a portion of the second conductive line; and
    forming a second conductive feature in the second opening contacting the exposed portion of the first conductive line.

10. The method of claim 9, wherein the first and second conductive features comprise first and second gate structures, the first conductive line comprises a first storage node of a memory cell, and the second conductive line comprises a second storage node of the memory cell.

11. The method of claim 1, further comprising:
patterning the liner layer to expose a portion of the first source/drain region while covering the second source/drain region in the first trench; and
forming the first conductive line in the first trench, the first conductive line contacting the exposed portion of the first source/drain region.

12. A method, comprising:
forming a first set of vertical transistors above a first source/drain region, the first set including a first pull-down transistor, a first pull-up transistor, and a first pass gate transistor;
forming a second set of vertical transistors above a second source/drain region, the second set including a second pull-down transistor, a second pull-up transistor, and a second pass gate transistor, wherein the first and second sets of vertical transistors are interconnected to define a memory cell;
forming an isolation structure between the first and second source/drain regions;
forming first and second trenches in the first and second source/drain regions and the isolation structure;
forming a liner layer in the first and second trenches;
patterning the liner layer to expose a portion of the first source/drain region in the first trench and to expose a portion of the second source/drain region in the second trench;
forming a first conductive line in the first trench, the first conductive line contacting the exposed portion of the first source/drain region;
forming a second conductive line in the second trench, the second conductive line contacting the exposed portion of the second source/drain region;
forming a bottom spacer above the first and second source/drain regions and the first and second conductive lines;
forming a first shared gate structure for the first pull-down transistor and the first pull-up transistor;
forming a second shared gate structure for the second pull-down transistor and the second pull-up transistor;
forming a first opening in the bottom spacer to expose a portion of the first conductive line;
forming a second opening in the bottom spacer to expose a portion of the second conductive line;
forming a first gate shunt contact in the first opening connecting the second shared gate structure to the exposed portion of the first conductive line to define a first storage node of the memory cell; and
forming a second gate shunt contact in the second opening connecting the first shared gate structure to the exposed portion of the second conductive line to define a second storage node of the memory cell.

13. The method of claim 12, further comprising forming the first and second openings in the bottom spacer prior to forming the first and second shared gate structures, wherein the first shared gate structure includes a first gate electrode defining the second gate shunt contact, and the second shared gate structure includes a second gate electrode defining the first gate shunt contact.

14. The method of claim 13, wherein forming the first and second shared gate structures comprises:
forming a gate insulation layer above the bottom spacer and in the first and second opening in the bottom spacer;
removing portions of the gate insulation layer disposed in the first and second openings;
forming the first gate electrode above the gate insulation layer and in the second opening; and
forming the second gate electrode above the gate insulation layer and in the first opening.

15. The method of claim 12, wherein the first and second bottom source/drain regions each comprises a P-type region, a first N-type region positioned on a first side of the P-type-region, a second N-type region positioned on a second side of the P-type region, and a conductive layer formed above the P-type region and the first and second N-type regions.

16. A device, comprising:
a plurality of vertically oriented channel (VOC) structures;
a first source/drain region positioned between a first pair of the plurality of VOC structures;
a second source/drain region positioned between a second pair of the plurality of VOC structures;
an isolation structure positioned between the first and second source/drain regions;
a first trench defined in the first and second source/drain regions and the isolation structure;
a liner layer lining the first trench;
a first buried interconnect line positioned in the first trench;
a dielectric material positioned above the first buried interconnect line; and
a first conductive feature positioned in the dielectric material and contacting a portion of the first buried interconnect line.

17. The device of claim 16, wherein the dielectric material comprises a bottom spacer, wherein the bottom spacer is positioned above the first and second source/drain regions and the first buried interconnect line.

18. The device of claim 17, wherein the first conductive feature comprises a gate electrode of a gate structure.

19. The device of claim 16, wherein the first and second bottom source/drain regions each comprises a P-type region, a first N-type region positioned on a first side of the P-type-region, a second N-type region positioned on a second side of the P-type region, and a conductive layer formed above the P-type region and the first and second N-type regions.

20. The device of claim 16, wherein the first conductive line contacts a portion of the first source/drain region through a first opening in the liner layer, and the device further comprises:
a second trench defined in the first and second source/drain regions and the isolation structure, wherein the liner layer lines the second trench;
a second buried interconnect line positioned in the second trench and contacting a portion of the second source/drain region through a second opening in the liner layer, wherein the dielectric material is positioned above the second buried interconnect line; and
a second conductive feature positioned in the dielectric material and contacting a portion of the second buried interconnect line.

* * * * *